United States Patent
Berkram et al.

(10) Patent No.: US 7,075,351 B2
(45) Date of Patent: *Jul. 11, 2006

(54) METHOD AND APPARATUS FOR GENERATING A MULTIPHASE CLOCK

(75) Inventors: Daniel A. Berkram, Fort Collins, CO (US); Perry M. Wyatt, Fort Collins, CO (US); David T. Newsome, Denver, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/112,162

(22) Filed: Apr. 22, 2005

(65) Prior Publication Data

US 2005/0264337 A1    Dec. 1, 2005

Related U.S. Application Data

(63) Continuation-in-part of application No. 10/733,790, filed on Dec. 10, 2003, now Pat. No. 6,917,232.

(51) Int. Cl.
*H03H 11/16* (2006.01)
*H03K 3/00* (2006.01)

(52) U.S. Cl. ...................................... 327/238; 327/254
(58) Field of Classification Search .................... None
See application file for complete search history.

(56) References Cited

U.S. PATENT DOCUMENTS

| 6,282,413 B1 | 8/2001 | Baltus ........................ 455/260 |
| 6,337,976 B1 | 1/2002 | Kudou ........................ 455/258 |
| 6,466,086 B1 | 10/2002 | Syoji ........................... 329/308 |
| 6,545,546 B1 | 4/2003 | Takeshita et al. ............. 331/11 |

*Primary Examiner*—Tuan T. Lam

(57) ABSTRACT

A multiphase clock generating apparatus includes a clock generator providing an M-clock having a frequency M times that of a received reference clock. Divider circuitry is coupled to provide an alignment signal having 1/M the frequency of the M-clock. A recovery circuit recovers up to M distinct clocks from the M-clock in accordance with the alignment signal. The recovered clocks have substantially an N•180°/M phase difference from each other, wherein N≧1.

21 Claims, 14 Drawing Sheets

METHOD AND APPARATUS FOR GENERATING A MULTIPHASE CLOCK

CROSS-REFERENCE TO RELATED APPLICATIONS

This application is a continuation-in-part of application Ser. No. 10/733,790, filed Dec. 10, 2003, now U.S. Pat. No. 6,917,232.

BACKGROUND

Digital logic circuits frequently rely on clock signals for synchronization, derivation of reference signals, measuring phase differences, and other functions. Some applications require a quadrature clock that has a 90° phase difference from a reference clock. A quadrature clock is frequently used for strobe signals, for example.

A centralized quadrature clock may be generated and distributed to all components. In particular, a first clock and a second clock having a 90° phase difference from the first clock are centrally generated and distributed. One disadvantage of this approach is that clock signals tend to have constraints that are difficult to maintain throughout the distribution when the distribution is over a relatively large area or used to drive a relatively large number of components. For example, significant consumption of die area and wire routing resources are required to meet skew requirements for both clocks in integrated circuit applications. The use of some types of integrated circuit logic in the clock distribution buffers may even result in a doubling of the power consumption due to the distribution of two clocks.

Another technique for generating the quadrature clock entails distributing a reference clock signal to regions of an integrated circuit. Each region has a local phase locked loop (PLL) or local delay locked loop (DLL) to derive the quadrature clock signal from the reference clock signal. A disadvantage of this approach is that the localized PLLs or DLLs introduce complexity into the integrated circuit design thus incurring more design and verification time. In addition, co-ordinating selection from the reference clock of the proper phase associated with the first and second clocks across all regions such that the first clock in one region is in phase with the first clock of another region is problematic.

SUMMARY

Various methods and apparatus for generating a multiphase clock are described. In one embodiment, a multiphase clock generating apparatus includes a clock generator providing an M-clock having a frequency that is M times that of a received reference clock. Divider circuitry is coupled to provide an alignment signal having a frequency 1/M that of the M-clock. A recovery circuit recovers up to M distinct clocks from the M-clock in accordance with the alignment signal. The M distinct clocks have a relative phase displacement of N•180°/M.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
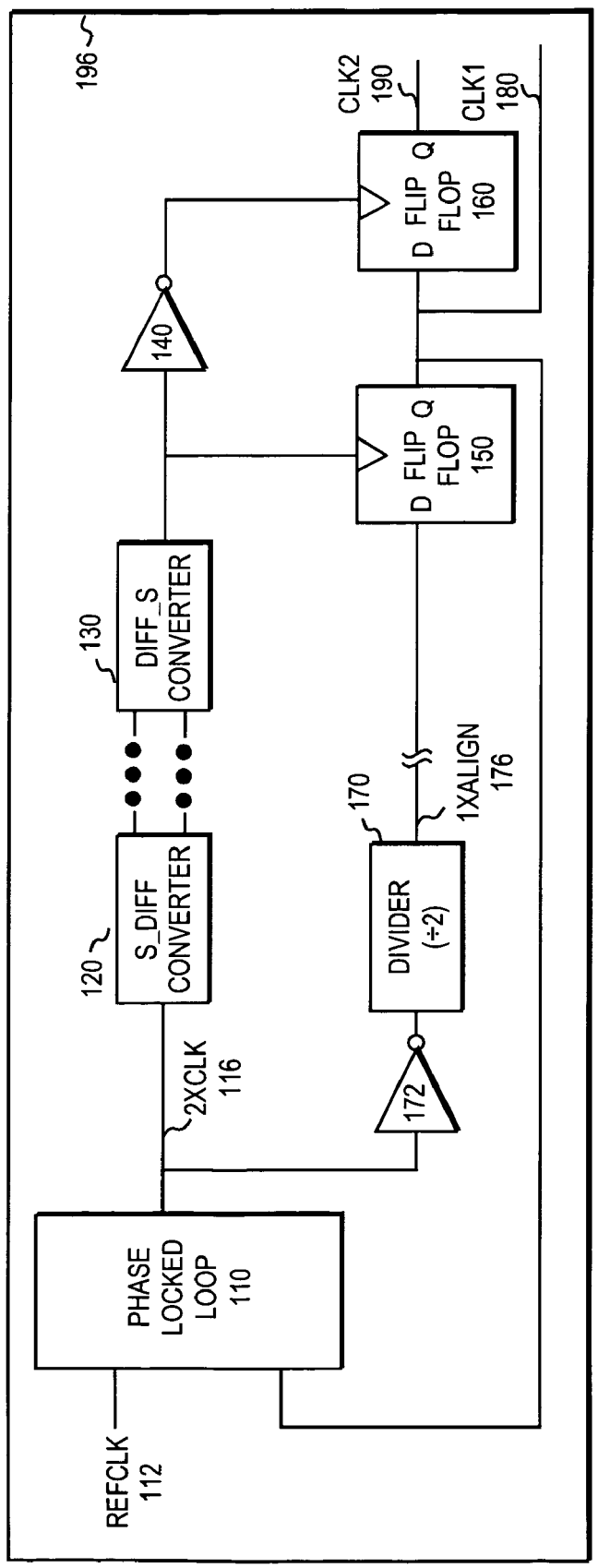
FIG. 1 illustrates one embodiment of quadrature clock generation circuitry.

FIG. 1 illustrates one embodiment of quadrature clock generation circuitry for generating a first clock CLK1 180 and a second clock CLK2 190. The second clock has a quadrature relationship to the first clock. In one embodiment, the clock generation circuitry resides on an integrated circuit die 196.

Clock generator 110 generates an output 116 having a frequency that is a multiple, m, of the frequency of a reference clock, REFCLK 112. In the illustrated embodiment, clock generator 110 is a phase locked loop (PLL). The PLL has a feedback path including inverter 172, divider 170, and flip-flop 150.

As a result of the divide-by-m divider, the frequency of the PLL output 116 is m times the frequency of REFCLK 112. The output of divider 170 has a frequency that is 1/m that of the PLL output.

In the illustrated embodiment, m=2 such that the PLL output is twice the frequency of REFCLK. PLL 110 is thus a clock generator that provides a double clock (2XCLK 116) that has a frequency twice that of the received reference clock, REFCLK.

In one embodiment, this 2XCLK 116 is distributed to the flip-flops 150, 160 in a differential form. Thus single-sided-to-differential converter 120 converts the single sided 2XCLK to a differential 2XCLK signal. Proximate the flip-flops, the differential-to-single-sided converter 130 converts the differential 2XCLK back to a single-sided 2XCLK.

Divider 170 and inverter 172 form divider circuitry for providing an alignment signal 1XALIGN 176 having a frequency that is 1/m that of the PLL output. In particular, the divider circuitry provides a 1XALIGN corresponding to an inverted PLL output divided by m. Given that the PLL output has a frequency that is m times the REFCLK frequency, the signal 1XALIGN 176 has a frequency that is the same as that of the REFCLK. Regardless of the value of m, the 1XALIGN will always have a frequency that is the same as that of the REFCLK.

In the illustrated embodiment, m=2 such that 1XALIGN corresponds to an inverted double clock divided by two. In the illustrated embodiment, the inverter 172 inverts the double clock such that the divider 170 receives an inverted double clock.

The 1XALIGN 176 is provided as a data input to flip-flop 150. The output of flip-flop 150 is the first clock CLK1 180. CLK1 is provided as a feedback input to PLL 110.

The double clock (i.e., 2XCLK) is used to clock flip-flop 150. The double clock is inverted by inverter 140 and the inverted double clock (i.e., $\overline{\text{2XCLK}}$) is used to clock flip-flop 160. Flip-flop 150 provides the first clock signal, CLK1 180. Flip-flop 160 provides the second clock signal, CLK2 190. The second clock has a 90° phase displacement from the first clock. In one embodiment, each of flip-flops 150, 160 is a D-type flip-flop.

PLL 110 drives the PLL output so as to minimize the phase difference between REFCLK and CLK1. Thus even if CLK1 and REFCLK are initially out of phase, PLL 110 will drive the PLL output to bring CLK1 and REFCLK into phase alignment.

In one embodiment, the clock generator, divider circuitry and recovery circuitry reside on a same integrated circuit die. In one embodiment, the clock generator, divider circuitry and recovery circuitry are formed as a metal oxide semiconductor field effect transistor (MOSFET) integrated circuit.

Figure 2:
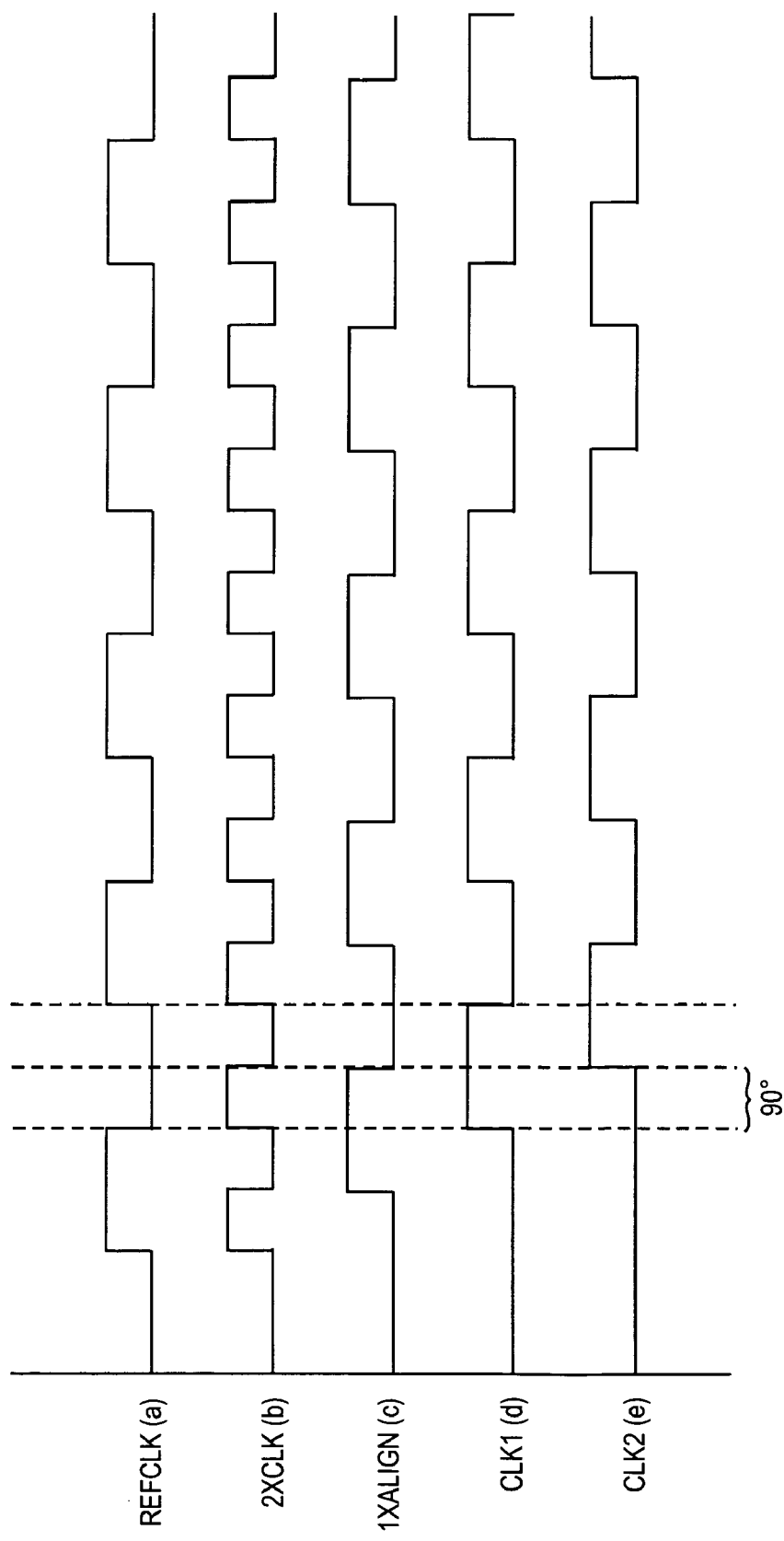
FIG. 2 illustrates one embodiment of waveforms associated with the clock generation circuitry of FIG. 1.

FIG. 2 illustrates waveforms for various signals present in the quadrature clock generation circuitry of FIG. 1. The 2XCLK waveform (b) has twice the frequency of REFCLK illustrated as waveform (a). The 1XALIGN waveform (c) has half the frequency as the double clock 2XCLK waveform. Accordingly, 1XALIGN and REFCLK have the same frequency. As a result of the inverted 2XCLK presented to the divider, the leading edge of the 1XALIGN signal is aligned with a falling edge of the 2XCLK signal.

Given that the CLK1 signal of waveform (d) is derived by clocking a flip-flop receiving the 1XALIGN signal, the CLK1 signal of waveform (d) will transition to the value of 1XALIGN on the rising edge of the 2XCLK.

The CLK2 signal will transition to the value of CLK1 on the rising edge of $\overline{\text{2XCLK}}$. Accordingly the CLK2 signal of waveform (e) transitions to the value of CLK1 on the falling edge of the 2XCLK. As indicated CLK2 has a 90° phase displacement from CLK1.

The synchronization between waveforms (b)–(e) is maintained even when the PLL has not locked. Although a 180° phase difference is illustrated with respect to REFCLK and CLK1, the PLL will adjust to bring REFCLK and CLK1 into phase alignment and the PLL will "lock" to maintain the alignment between CLK1 and REFCLK. Accordingly, the phase difference illustrated between CLK1 and REFCLK is only an initial condition. The synchronization between waveforms (a) and the remaining waveforms (b)–(e) will vary until the PLL locks at which point waveform (d) will be synchronized and in phase with waveform (a).

Figure 3:
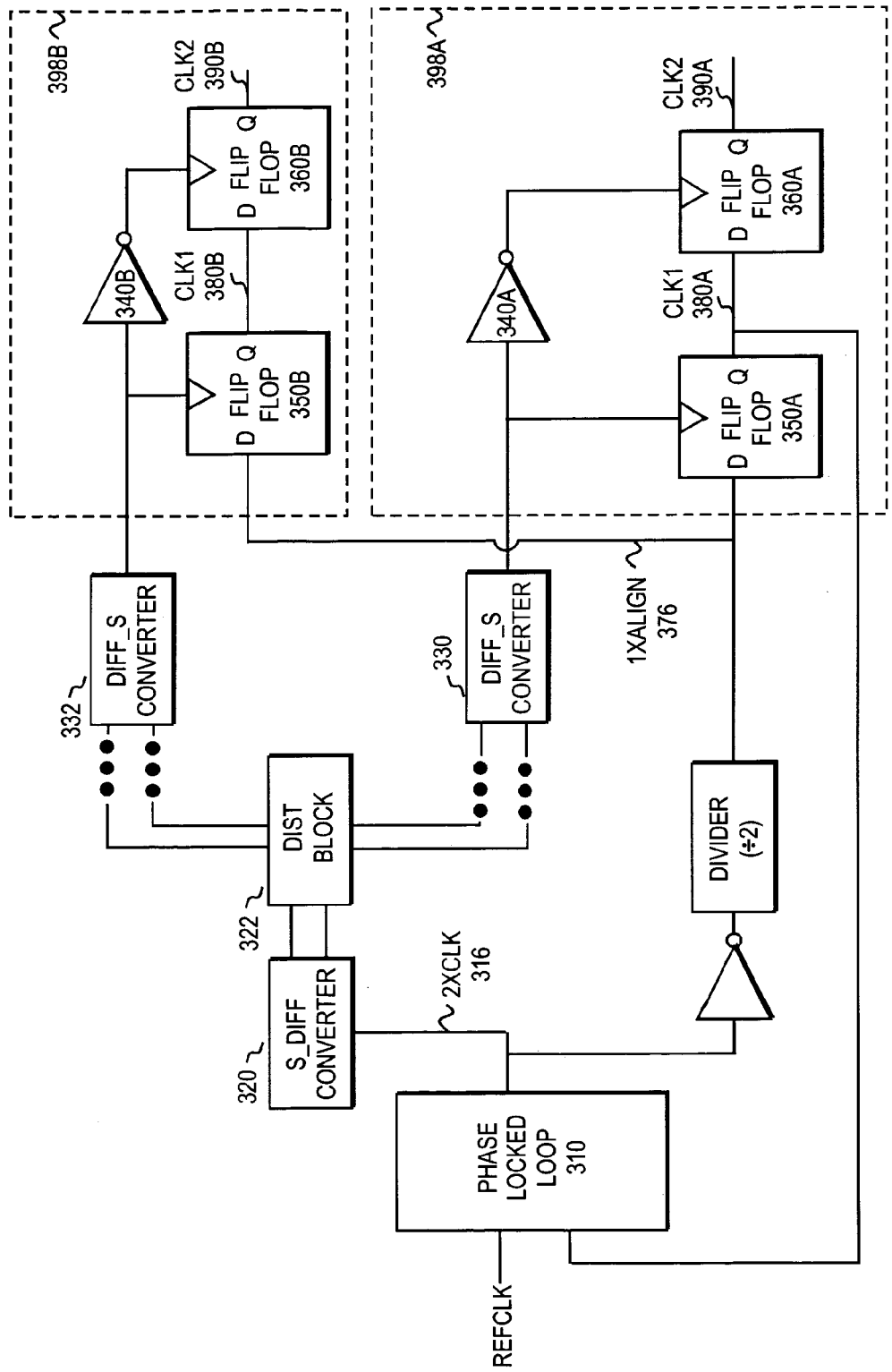
FIG. 3 illustrates one embodiment of quadrature clock generation circuitry providing a multiple instances of a quadrature clock.

FIG. 3 illustrates one embodiment of creating multiple instances of the quadrature clock. The quadrature clock distribution of FIG. 3 incorporates the benefits of both central generation and distributed generation through the use of multiple PLL/DLLs without the aforementioned disadvantages of either architecture.

The power requirements associated with central generation of the quadrature are avoided by using localized flip-flops to distribute the derived quadrature clock to a local region. Although the 1XALIGN signal is distributed to all local regions, the 1XALIGN signal is used for alignment only and is not used to drive either CLK1 or CLK2. The 2XCLK signal need only clock a few components within each local region rather than all clocked components throughout the integrated circuit.

Unlike the distributed PLL/DLL architecture, a single alignment signal enables selection of the proper edges of the 2XCLK signal associated with each of the CLK1 and CLK2 signals. Moreover, considerable skewing or drifting of 1XALIGN is tolerable because the 1XALIGN is used to identify which edges of the 2XCLK signal to select.

Given that CLK2 is derived from CLK1 rather than independently derived from the 1XALIGN, the 1XALIGN signal can shift almost 90° in either direction while associating the same edges of the 2XCLK with CLK1 or CLK2. Thus distribution of the 1XALIGN is substantially immune from ordinary clock skew considerations.

The 1XALIGN 376 is distributed to each local region associated with a recovery circuit. The double clock 316 (2XCLK) is similarly distributed to each local region. In the illustrated embodiment, the double clock is distributed as a differential double clock that is converted back to a single ended double clock at each local region. In particular, single-sided-to-differential converter 320 converts the single sided 2XCLK to a differential 2XCLK signal that is provided to distribution block 322. Proximate the flip-flops, the differential-to-single-sided converter 330, 332 associated with the local region converts the differential 2XCLK back to a single-sided 2XCLK.

Each local region includes a recovery circuitry 398B for recovering CLK1 and CLK2 from the distributed 2XCLK and 1XALIGN signals. In the illustrated embodiment, recovery circuit 398B includes flip-flops 350B, 360B, and inverter 340B for recovering or reproducing the CLK1 380B and CLK2 390B clocks. In one embodiment, an integrated circuit has a plurality of local regions requiring local generation of the quadrature clock from the distributed double clock and alignment signals.

CLK1 380A and CLK1 380B are distinctly generated instances of the same clock signal, CLK1. Similarly, CLK2 390A and CLK2 390B are distinctly generated instances of the same clock signal, CLK2. Thus CLK1 380A=CLK1 380B even though they are independently derived from the 2XCLK and 1XALIGN signals. Similarly, CLK2 390A=CLK2 390B even though they are independently derived from the 2XCLK and 1XALIGN signals. PLL 310 only requires one instance of the first clock for feedback. Thus only one of CLK1 380A . . . 380B is provided to PLL 310 for feedback.

Figure 4:
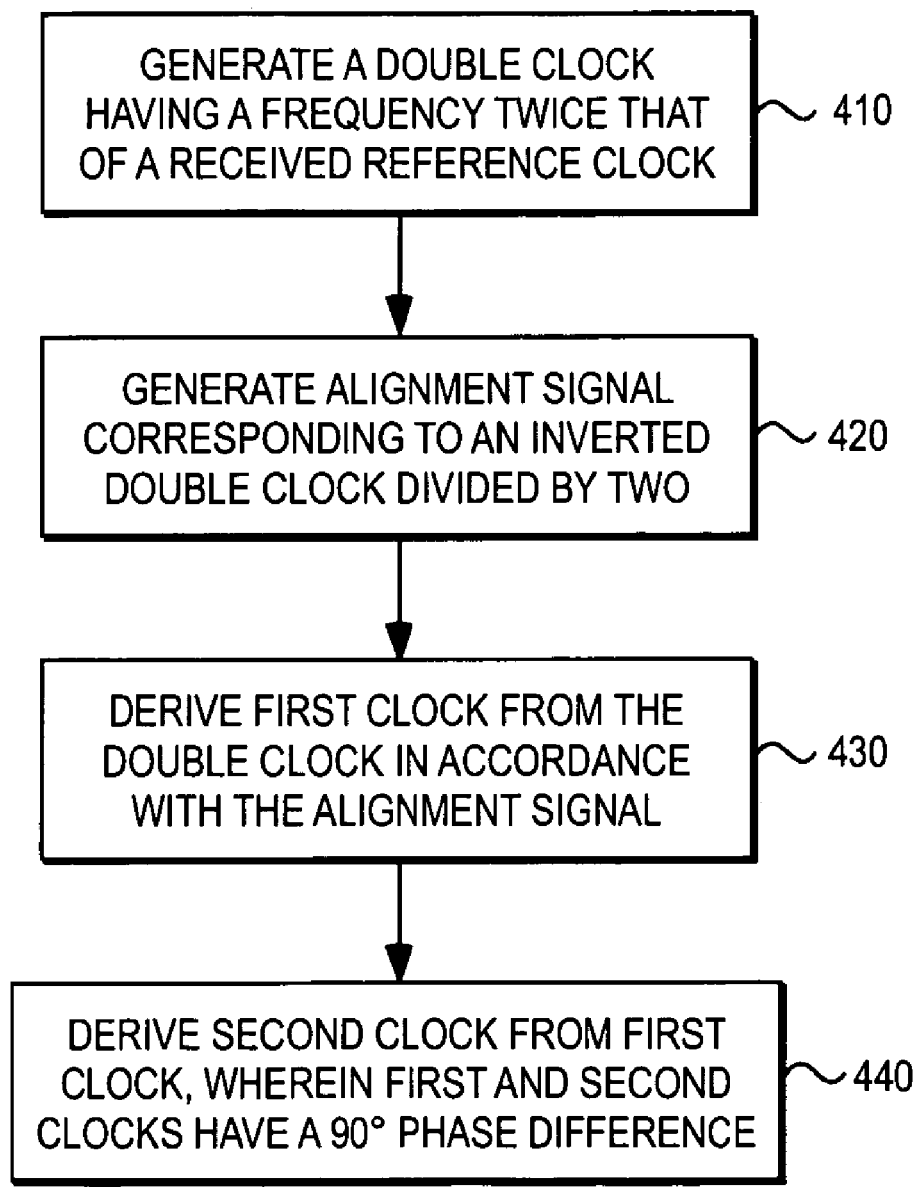
FIG. 4 illustrates one embodiment of a method for generating a quadrature clock.

FIG. 4 illustrates one embodiment of a method for generating a quadrature clock. In step 410, a double clock having a frequency twice that of a received reference clock is generated. An alignment signal corresponding to an inverted double clock divided by two is generated in step 420. A first clock is derived from the double clock in accordance with the alignment signal in step 430. The alignment signal identifies which edges of the double clock are associated with the first clock. The second clock is also derived from the alignment signal. In FIGS. 1, 3 the first clock is latched to provide the second clock in accordance with the inverted double clock. Thus in step 440, the second clock is derived from the first clock. The first and second clocks have substantially a 90° phase difference.

The ability to halt and step the quadrature clock is useful for testing the integrated circuit incorporating the quadrature clock of FIGS. 1 and 3. The ability to stop the quadrature clock at a particular level and subsequently step the quadrature clock requires additional circuitry.

Figure 5:
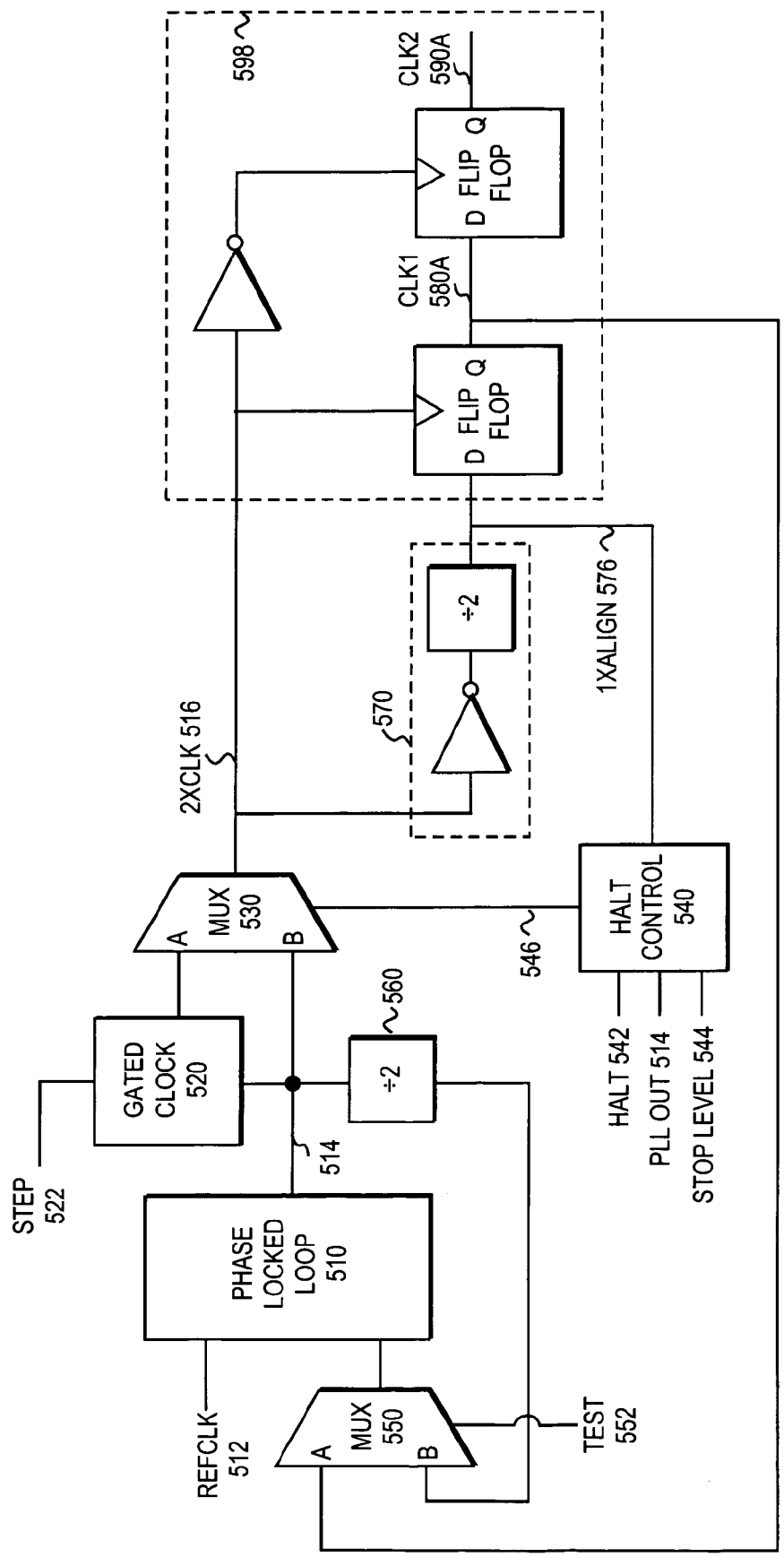
FIG. 5 illustrates one embodiment of an apparatus for generating and controlling the quadrature clock.

FIG. 5 illustrates one embodiment of a quadrature clock generator including circuitry for halting and stepping the quadrature clock. Controlling the quadrature clock in such a fashion may be provided in a test mode of operation in contrast with a normal mode of operation. PLL 510 cannot simply be stopped and re-started in a locked condition. Logic 530, 560, and 550 effectively serve as a "clutch" mechanism to couple or de-couple the divider and recovery circuits between the PLL 510 and a gated clock 520 when halting and stepping the quadrature clock from a particular level or phase is desired in a test mode.

Halt control 540 generates the halt multiplexer control 546 used to control selection of the double clock and selection of the PLL feedback path. Multiplexer 530 selects the double clock 516 (2XCLK) as either the PLL output 514 or the gated clock 520 in accordance with the halt multiplexer control 546. The gated clock 520 gates the PLL output 514 in accordance with a step signal 522.

When multiplexer 530 selects the gated clock 520 to provide the double clock 516, the CLK1 580 signal is unsuitable as a feedback signal to the PLL 510 given that PLL 510 is no longer directly driving the double clock that CLK1 is derived from. Accordingly, multiplexer 550 and divider 560 provide a feedback clock signal having a frequency half that of the PLL output 514 in lieu of CLK1 580 to the PLL. This alternate feedback path may be referred to as the bypass feedback path or test feedback path.

The gated clock 520 ensures that any changes in double clock are synchronized with the PLL output 514 in the test mode. The halt control 546 ensures that transitions between the halt and "free-running" conditions during a test mode are synchronized with transitions in the PLL output state 514.

FIG. 5 thus illustrates a clock generator providing a clock output 514 having a frequency that is twice that of a received reference clock 512. A multiplexer 530 is coupled to select one of the clock output 514 and a gated clock 520 output as a double clock 516 in accordance with a halt multiplexer control 546. Divider circuitry 570 divides the double clock to provide an alignment signal 576 with a frequency half that of the double clock. A recovery circuit 598 recovers a first clock 580A and a second clock 590A from the double clock 516 in accordance with the alignment signal 576, wherein the first and second clocks have substantially a 90° phase difference.

The halt control should be disabled during normal operation. This is accomplished in one embodiment by tying HALT 542 to a logic level that ensures halt multiplexer control 546 always selects PLL output 514 during normal operational modes. Stop level 544 indicates the logic level at which the halt should occur as further described with respect to FIG. 6.

Multiplexer 550 provides a selected one of a normal feedback path or a test feedback path to PLL 510 in accordance with the signal, TEST 552. During normal operation, the normal feedback path with CLK1 580 is selected as the feedback clock signal for the PLL. When testing, however, CLK1 580 is not being directly driven by the PLL and is not a suitable feedback signal. Accordingly, a divided PLL output (due to divider 560) is selected as the feedback clock signal from a test feedback path when testing. TEST 552 is tied to a logic level that ensures multiplexer 550 selects CLK1 580 as the feedback clock for PLL 510 during the normal operational modes. TEST 552 provides the test feedback path to PLL during test modes.

Figure 6:
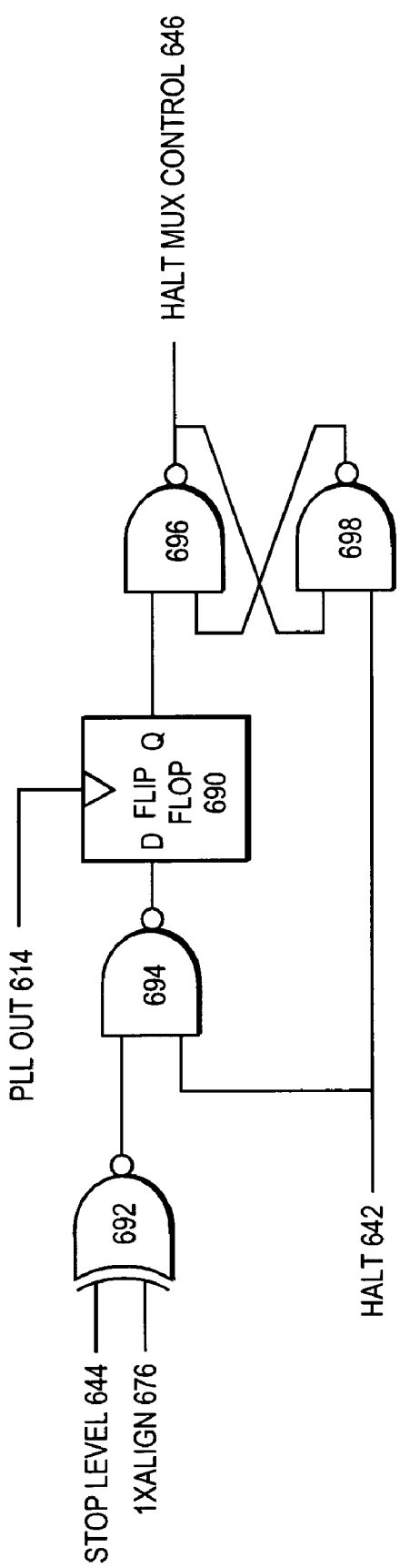
FIG. 6 illustrates one embodiment of a halt control circuit for controllably halting and stepping the quadrature clock.

FIG. 6 illustrates one embodiment of the halt control 540 of FIG. 5. The halt control circuitry generates halt multiplexer control 646 from inputs stop level 644, 1XALIGN 676, halt 642, and PLL out 614.

The 1XALIGN 676 and STOP LEVEL 644 are provided as inputs to exclusive NOR gate 692. STOP LEVEL 644 indicates whether CLK1 should be stopped at either a high or a low level. NAND gate 694 receives a halt signal 642 and the output of exclusive NOR gate 692. The output of exclusive NOR gate 692 is provided as the data input to flip-flop 690. In one embodiment flip-flop 690 is a D-type flip-flop.

Cross-coupled NAND gates 696 and 698 form a latch providing the halt multiplexer control 646. Tying HALT 642 to a low logic level ensures that the halt multiplexer control is also a low logic level. Referring to FIG. 5, the halt control circuit 540 should be disabled during normal operation of the quadrature clock generator when the PLL output 514 is the double clock. Multiplexer 530 selects the gated clock 520 when A=halt multiplexer control 546 or the PLL output when B=halt multiplexer control. For the halt control circuit of FIG. 6, this implies that B=0 and A=1 because the halt multiplexer control is 0 when disabled.

When HALT is enabled, the halt multiplexer control selects the gated clock as the double clock when the 1XALIGN 676 and STOP LEVEL 644 match. STOP LEVEL indicates which clock level to stop at (i.e., low, high). Note the use of 1XALIGN rather than the CLK1 signal in the combinatorial logic of FIG. 6. Due to the high frequency of the 2XCLK and the electrical length of the path to the multiple instances of the recovery circuits, the 1XALIGN rather than the CLK1 signal should be used.

Figure 7:
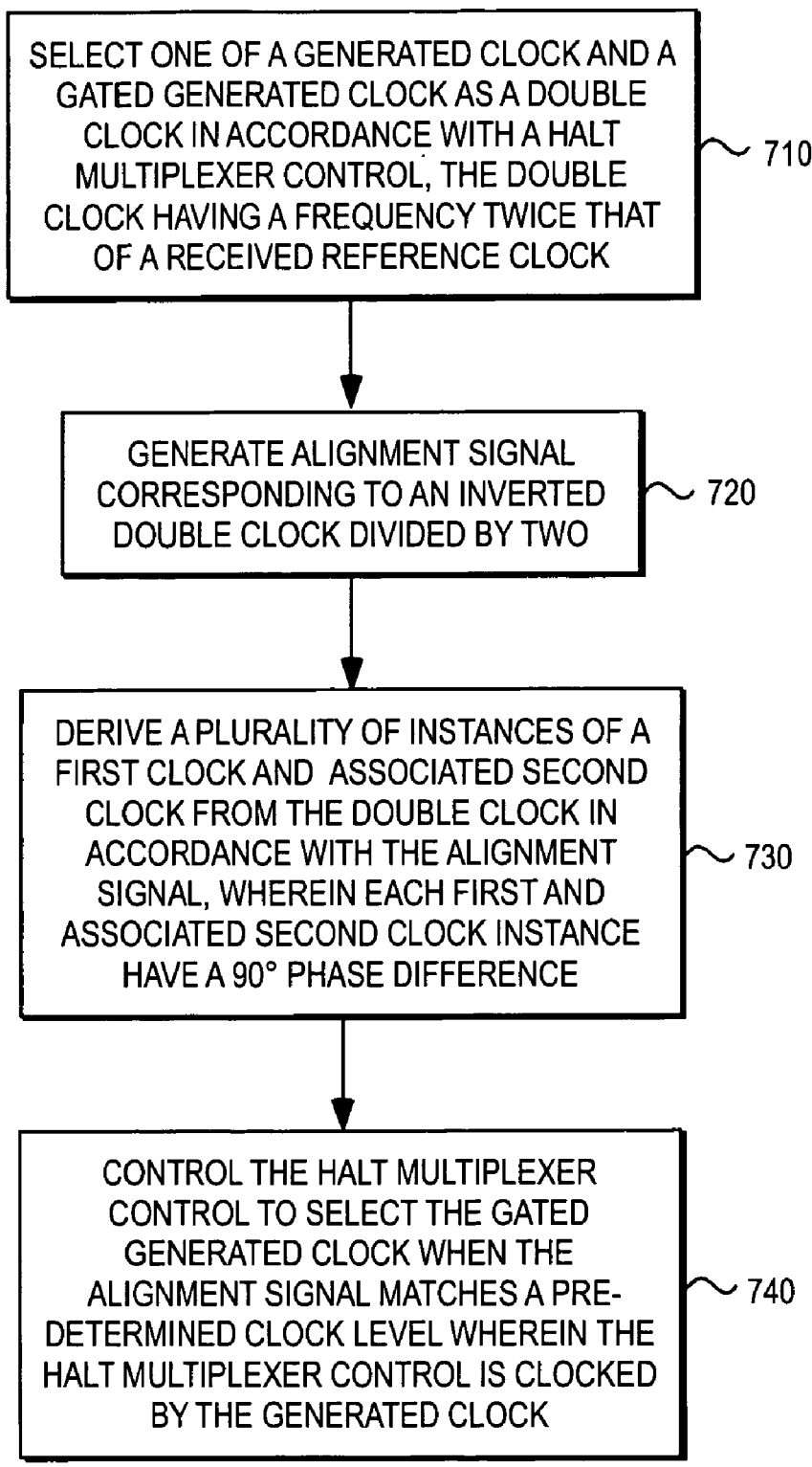
FIG. 7 illustrates one embodiment of a method for generating and controlling the quadrature clock.

FIG. 7 illustrates one embodiment of a method of generating and controlling the quadrature clock. In step 710, one of a generated clock (e.g., PLL out 514) and a gated generated clock (e.g., gated clock 520) is selected as a double clock in accordance with a halt multiplexer control. The double clock has a frequency twice that of a received reference clock.

An alignment signal corresponding to an inverted double clock divided by two is generated in step 720. A plurality of instances of a first clock and associated second clock are derived from the double clock in accordance with the alignment signal in step 730. Each first and associated second clock instance have a relative 90° phase difference.

In step 740, the halt multiplexer control is controlled to select the gated generated clock signal when the alignment signal matches a pre-determined clock level. The halt multiplexer control is clocked by the generated clock for synchronization with the generated clock.

The halt multiplexer control thus permits the user to stop all instances of the quadrature clock at a particular level in synchronization with the generated clock. Once the gated generated clock is selected, the user may step the quadrature clock instances through the quadrature clock cycles such that the quadrature clock instances are synchronized with each other.

Figure 8:
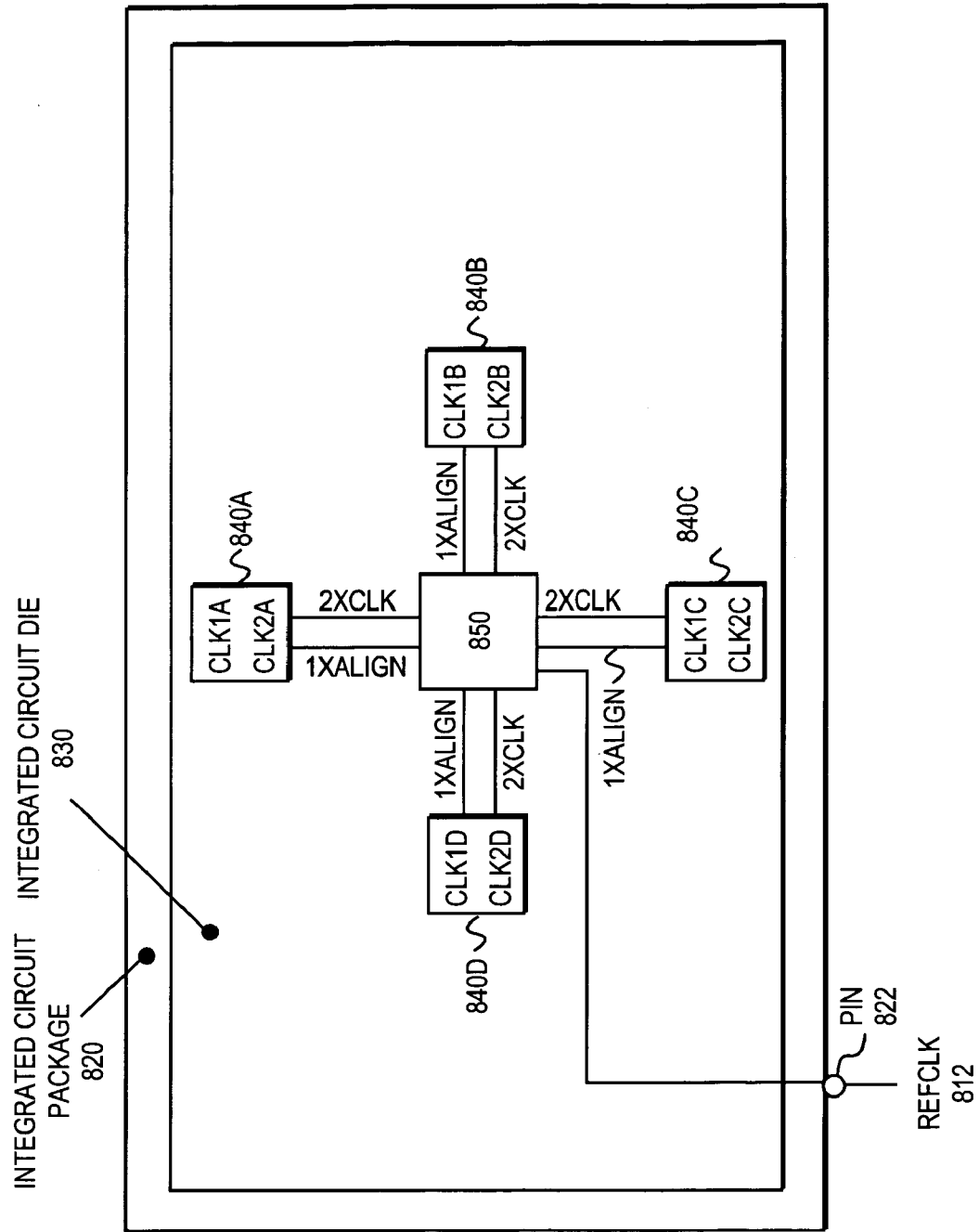
FIG. 8 illustrates one embodiment of quadrature clock generation and distribution across an integrated circuit die within an integrated circuit package.

FIG. 8 illustrates one embodiment of quadrature clock generation and distribution across an integrated circuit die. A clock generator is fabricated on a given area 850 of an integrated circuit die 830. The 1XALIGN and the double clock (2XCLK) are distributed to each of a plurality of local regions 840A, 840B, 840C, . . . 840D. Each local region has a recovery circuit for deriving a local instance of CLK1 and CLK2 from the 2XCLK and 1XALIGN signals.

The CLK1 instances are relatively phase aligned such that CLK1A=CLK1B=CLKLC . . . =CLK1D). Similarly, the CLK2 instances are relatively phase aligned such that CLK2A=CLK2B=CLK2C . . . =CLK2C). Each CLK2 instance has a 90° phase difference from its associated CLK1 instance (as well as the other instances of CLK1).

The integrated circuit die 830 resides within an integrated circuit package 820. A REFCLK 812 is provided to the clock generator 830 via an external pin 822 of the integrated circuit package 820.

The quadrature clock is a special case of a multiphase clock that provides for a 90° phase difference. In some cases a phase difference other than 90° may be desirable.

Figure 9:
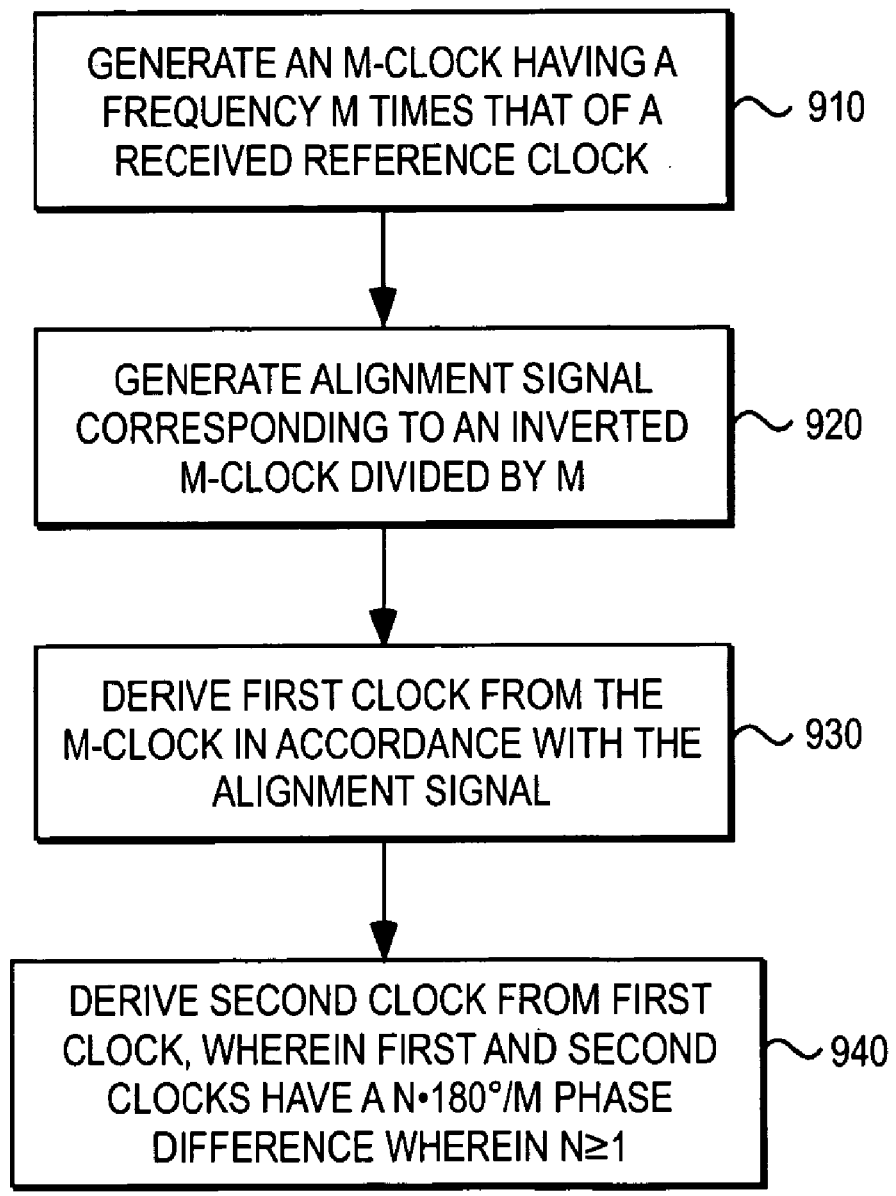
FIG. 9 illustrates one embodiment of a method of generating a multiphase clock.

FIG. 9 illustrates one embodiment of a method of generating a multiphase clock. In step 910, an M-clock having a frequency M times that of a received reference clock is generated. An alignment signal corresponding to an inverted M-clock divided by M is generated in step 920. A first clock is derived from the M-clock in accordance with the alignment signal in step 930. In step 940, a second clock is derived from the first clock wherein a phase difference between the first and second clocks is N•180°/M, wherein N≧1. Selecting M and N such that $$\frac{M}{N} = 2$$

results in a quadrature clock. Selecting $$\frac{M}{N} > 2$$

(e.g., N=1, M=3) permits relative phase differences of less than 90°.

Figure 10:
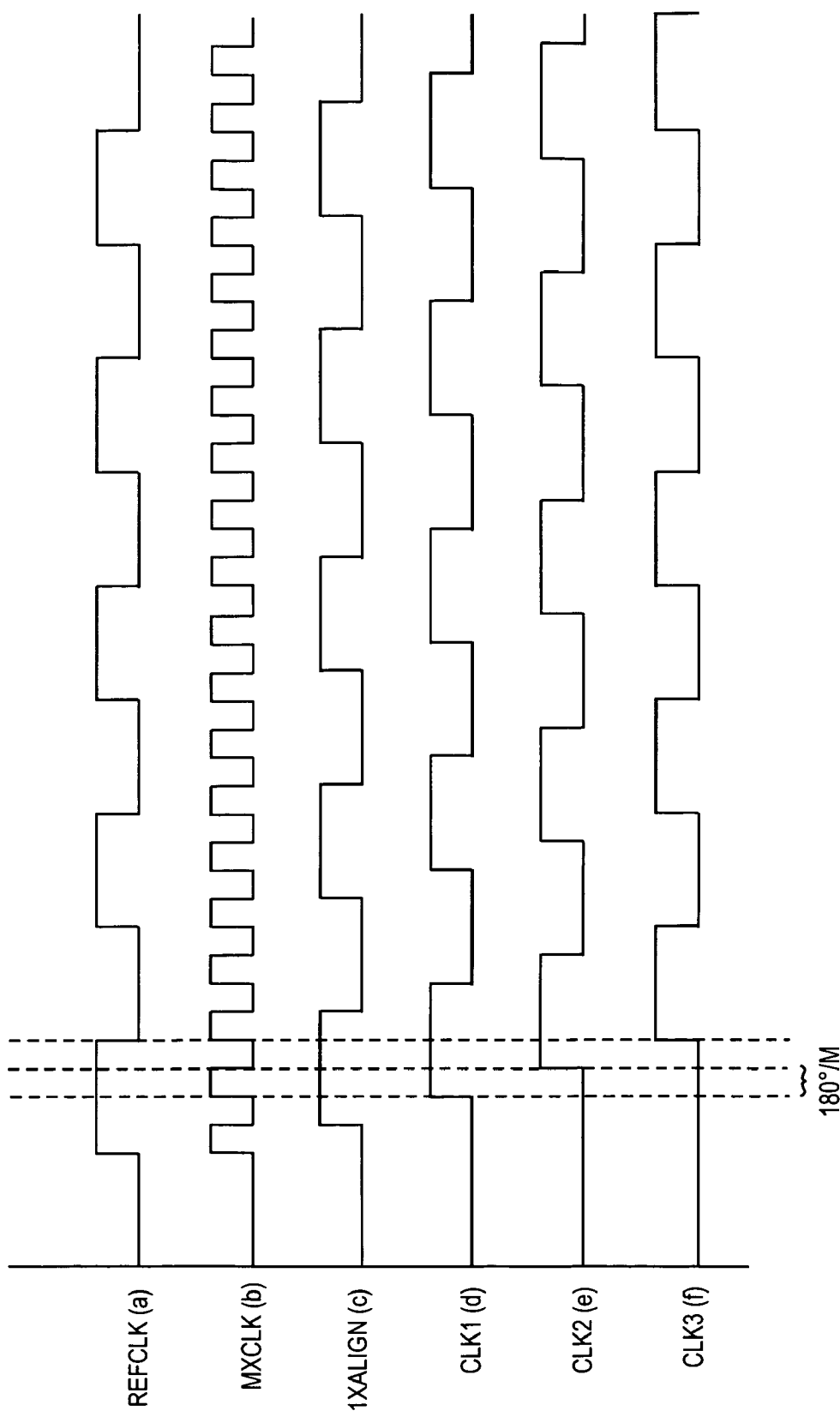
FIG. 10 illustrates one embodiment of waveforms associated with the clock generation circuitry of FIG. 9.
Figure 11:
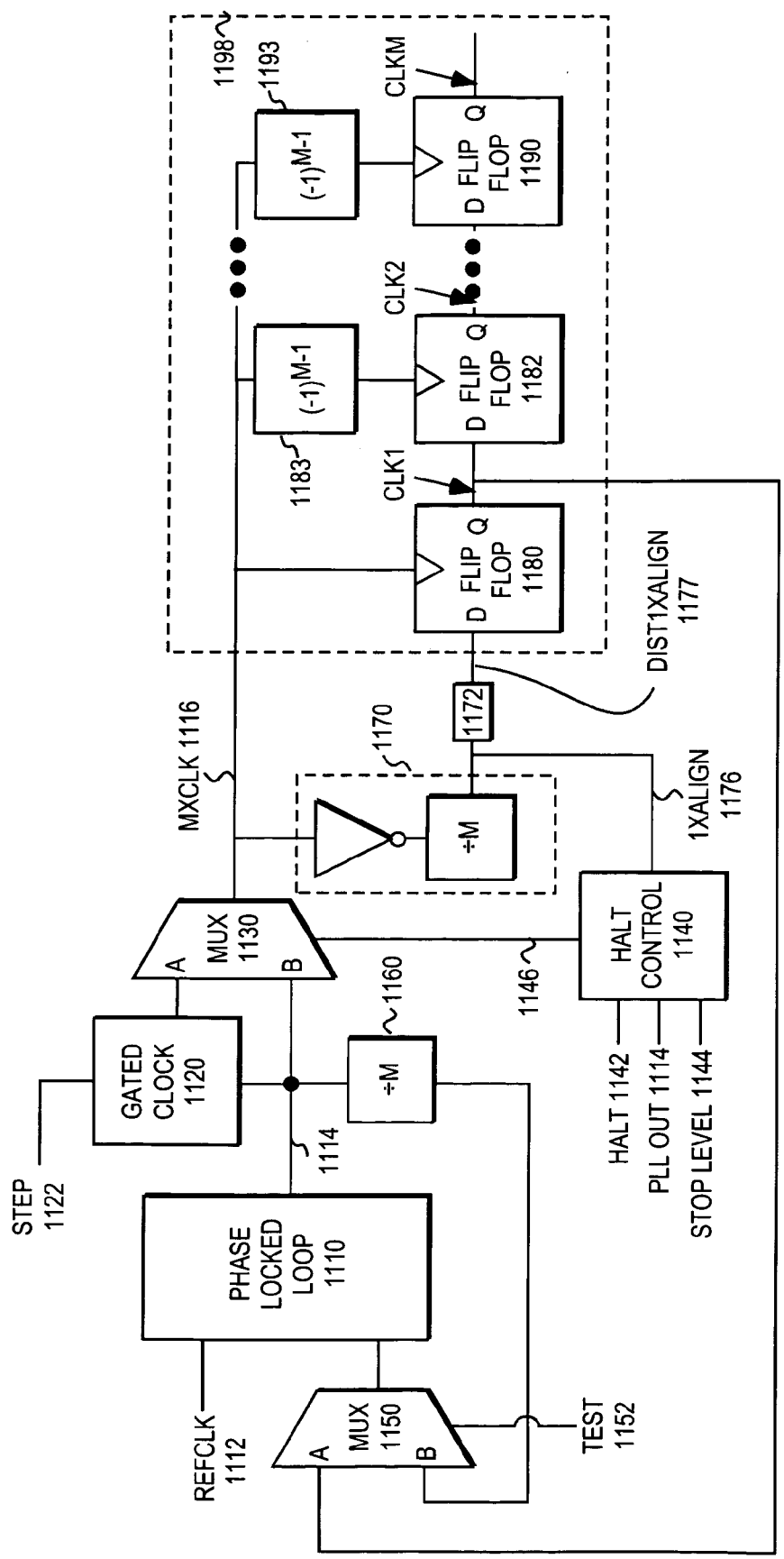
FIG. 11 illustrates one embodiment of a multiphase clock generator including circuitry for halting and stepping the multiphase clock.

FIG. 10 illustrates waveforms for various signals present in the multiphase clock generation circuitry of FIG. 11. The MXCLK waveform (b) has M times the frequency of REFCLK illustrated as waveform (a). In the illustrated embodiment, M=3. The 1XALIGN waveform (c) has 1/M the frequency of the MXCLK waveform. Accordingly, 1XALIGN and REFCLK have the same frequency. As a result of the inverted MXCLK presented to the divider, the leading edge of the 1XALIGN signal is aligned with a falling edge of the MXCLK signal.

Given that the CLK1 signal of waveform (d) is derived by clocking a flip-flop receiving the 1XALIGN signal, the CLK1 signal of waveform (d) will transition to the value of 1XALIGN on the rising edge of the MXCLK.

Each CLKi represents a stage of the recovery circuitry. MXCLK is used to clock the odd-numbered stages while $\overline{\text{MXCLK}}$ is used to clock the even-numbered stages. Although an inverter is illustrated for each even clock (i.e., CLKi where i is even), a single inverter may distribute $\overline{\text{MXCLK}}$ to all the even clocks.

The CLK2 signal will transition to the value of CLK1 on the rising edge of $\overline{\text{MXCLK}}$. Accordingly the CLK2 signal of waveform (e) transitions to the value of CLK1 on the falling edge of the MXCLK. For M=3, CLK2 will have a 60° phase displacement from CLK1. The CLK3 signal of waveform (f) transitions to the value of CLK2 on the rising edge of MXCLK. For M=3, CLK3 will have a 60° phase displacement from CLK2. As previously explained, the phase difference illustrated between CLK1 and REFCLK is only an initial condition. The synchronization between waveforms (a) and the remaining waveforms (b)–(e) will vary until the PLL locks at which point waveform (d) will be synchronized and in phase with waveform (a).

FIG. 11 illustrates one embodiment of a multiphase clock generator including circuitry for halting and stepping the multiphase clock. Controlling the multiphase clock in such a fashion may be provided in a test mode of operation in contrast with a normal mode of operation. PLL 1110 cannot simply be stopped and re-started in a locked condition. Logic 1130, 1160, and 1150 effectively serve as a "clutch" mechanism to couple or de-couple the divider and recovery circuits between the PLL 1110 and a gated clock 1120 when halting and stepping the multiphase clock from a particular level or phase is desired in a test mode.

The recovery circuitry 1198 comprises a plurality of sequential stages such that an output of stage i is the input to stage i+1. The first stage (i=1) receives the alignment signal 1176. The signal used to clock each stage is $(-1)^{i+1}$ MXCLOCK, where i represents the ith stage (i.e., CLKi). In the illustrated embodiment, each stage includes a D-type flip-flop. Thus MXCLK is used to clock the flip-flops when i is odd (i.e., CLK1, CLK3, etc.) while $\overline{\text{MXCLK}}$ is used to clock the flip-flops associated when i is even (i.e., CLK2, CLK4, etc.). Although an inverter is illustrated for each even stage, a single inverter may distribute the $\overline{\text{MXCLK}}$ to the flip-flops for all the even-numbered stages. Alternatively an inverter may be used with each stage to invert the clocking signal associated with the preceding stage, however, the cumulative delay for all the inverters may be undesirable for larger M.

When expanding the multiphase clock generator beyond two phases, divider circuitry 1170 must either have a duty cycle greater than 50% or a delay must be introduced to prevent a race condition when M>2.

In one embodiment, a delay element such as element 1172 may be provided to ensure sufficient delay to avoid a race condition. The halt control circuit 1140 may receive the 1XALIGN 1176 output from the divider circuitry 1170 prior to the delay element 1172 because the halt control circuit is relying upon a 50% duty cycle divider circuit. The output of the delay element 1172 is the distributed alignment signal (DIST1XALIGN 1177) that is distributed to each of the recovery circuits. In one embodiment, delay element 1172 comprises an even number (e.g., 2) of serially-coupled inverters to achieve the needed delay. Although this solution is feasible, careful routing is required to ensure that the serially-coupled inverters provides sufficient delay for each of the recovery circuits even though MXCLK and 1XALIGN might have very different routes (and therefore varying delays).

Halt control 1140 generates the halt multiplexer control 1146 used to control selection of the M-clock and selection of the PLL feedback path. Multiplexer 1130 selects the M-clock 1116 (MXCLK) as either the PLL output 1114 or the gated clock 1120 in accordance with the halt multiplexer control 1146. The gated clock 1120 gates the PLL output 1114 in accordance with a step signal 1122.

When multiplexer 1130 selects the gated clock 1120 to provide the M-clock 1116, the CLK1 1180 signal is unsuitable as a feedback signal to the PLL 1110 given that PLL 1110 is no longer directly driving the M-clock that CLK1 is derived from. Accordingly, multiplexer 1150 and divider 1160 provide a feedback clock signal having a frequency 1/M that of the PLL output 1114 in lieu of CLK1 1180 to the PLL. This alternate feedback path may be referred to as the bypass feedback path or test feedback path.

The gated clock 1120 ensures that any changes in M-clock are synchronized with the PLL output 1114 in the test mode. The halt control 1146 ensures that transitions between the halt and "free-running" conditions during a test mode are synchronized with transitions in the PLL output state 1114.

The halt control should be disabled during normal operation. This is accomplished in one embodiment by tying HALT 1142 to a logic level that ensures halt multiplexer control 1146 always selects PLL output 1114 during normal operational modes.

Multiplexer 1150 provides a selected one of a normal feedback path or a test feedback path to PLL 1110 in accordance with the signal, TEST 1152. During normal operation, the normal feedback path with CLK1 1180 is selected as the feedback clock signal for the PLL. When testing, however, CLK1 1180 is not being directly driven by the PLL and is not a suitable feedback signal. Accordingly, a divided PLL output (due to divider 1160) is selected as the feedback clock signal from a test feedback path when testing. TEST 1152 is tied to a logic level that ensures multiplexer 1150 selects CLK1 1180 as the feedback clock for PLL 1110 during the normal operational modes. TEST 1152 provides the test feedback path to PLL during test modes.

FIG. 11 thus illustrates a clock generator providing an M-clock output having a frequency that is M times that of a received reference clock. A multiplexer is coupled to select one of the clock output and a gated clock output as a double clock in accordance with a halt multiplexer control. Divider circuitry divides the M-clock to provide an alignment signal with a frequency 1/M that of the double clock. A recovery circuit recovers up to M distinct clocks from the M-clock. For example, a first clock and a second clock can be derived from the M-clock in accordance with the alignment signal, wherein the first and second clocks have substantially a N•180°/M phase difference. If M=3 for example, then clocks that are multiples of 60° apart from each other may be recovered from the MXCLK signal as illustrated by waveforms (d), (e), (f) of FIG. 10. In one embodiment N=1 such that each successive clock (CLK2, CLK3, . . . CLKM) is 180°/M phase displaced from the preceding clock. Integer values of M thus produce the following phase displacements for successively recovered clocks:

| M | Δθ |
|---|---|
| 2 | 90° |
| 3 | 60° |
| 4 | 45° |
| 5 | 36° |
| 6 | 30° |
| 8 | 22.5° |
| 9 | 20° |
| 10 | 18° |
| 12 | 15° |
| 18 | 10° |

As with the quadrature clock example, a plurality of recovery circuits may be used to recover the M distinct clocks at different locations on the integrated circuit. Each recovery circuit, for example, may thus recover an associated first clock and an associated second clock in accordance with the alignment signal. The second clock is recovered from the first clock. The first and second clocks associated with each recovery circuit will have substantially a 180°/M phase difference.

Figure 12:
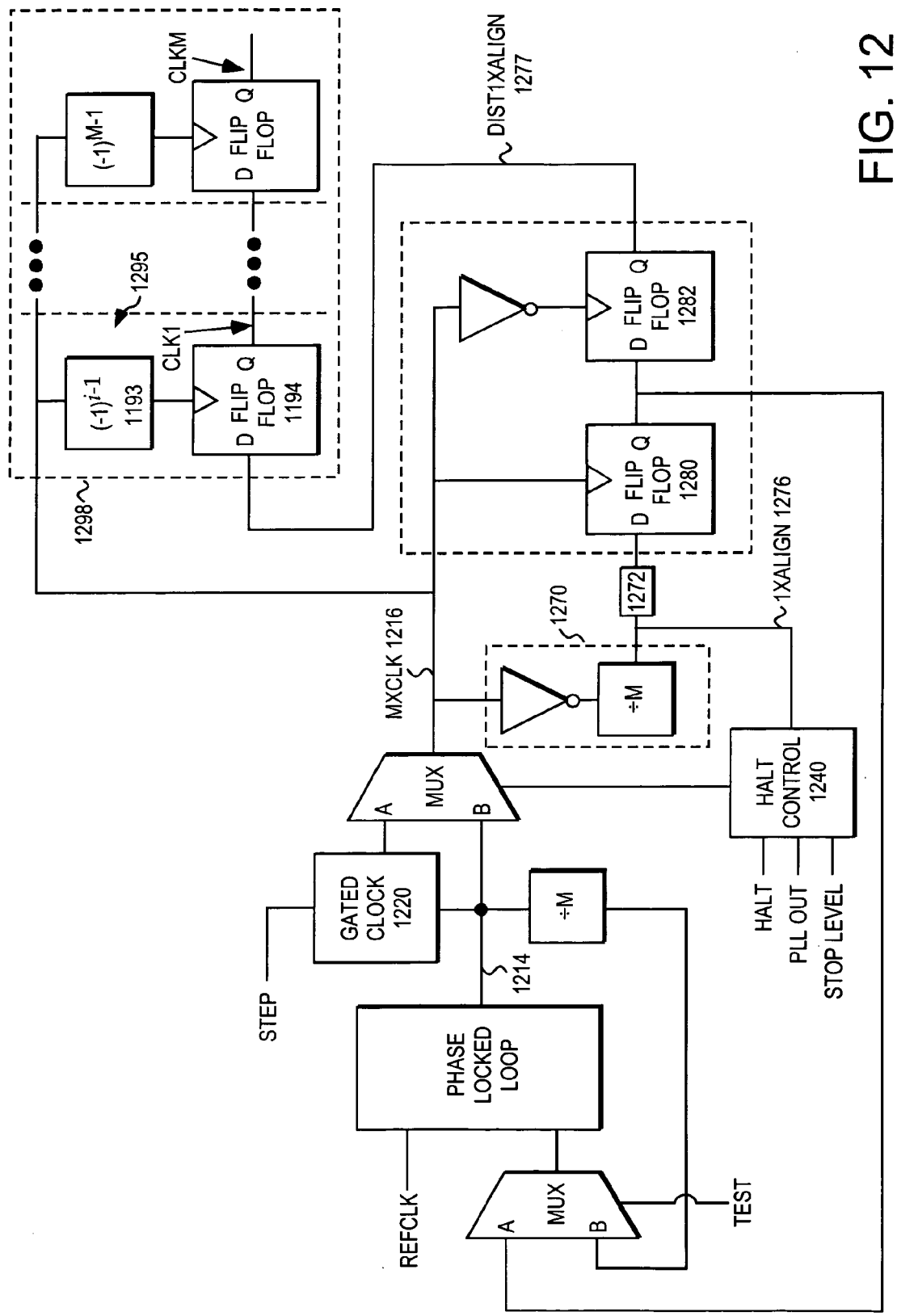
FIG. 12 illustrates one embodiment of a multiphase clock generator including circuitry for halting and stepping the multiphase clock.

In an alternative embodiment, another distributed alignment signal is generated to ensure sufficient margin from transitions in MXCLK to avoid a race condition. FIG. 12 illustrates the use of delay element 1272 in conjunction with the first two stages of a recovery circuit to generate a distributed alignment signal 1277 that may then be distributed to each of the recovery circuits 1298. The distributed alignment signal will effectively have a duty cycle greater than 50% because it will always be high for at least one more MXCLK phase than it will be low.

With respect to the multiphase clock circuitry of either FIG. 11 or FIG. 12, the recovery circuit (1198, 1298) comprises up to M stages, where the output of each stage represents one phase CLKi of the multiphase clock in accordance with its stage number, i. In one embodiment, each stage includes a D-type flip-flop. The D-type flip-flops are serially coupled so that the output of one flip-flop feeds the input of the next flip-flop of the recovery circuit. Each stage is clocked by a signal corresponding to $(-1)^{i-1}$ MXCLK, wherein i represents the number of the stage. Thus the even-numbered stages are clocked by an inverted MXCLK (i.e., $\overline{\text{MXCLK}}$) while the odd-numbered stages are clocked by MXCLK.

Figure 13:
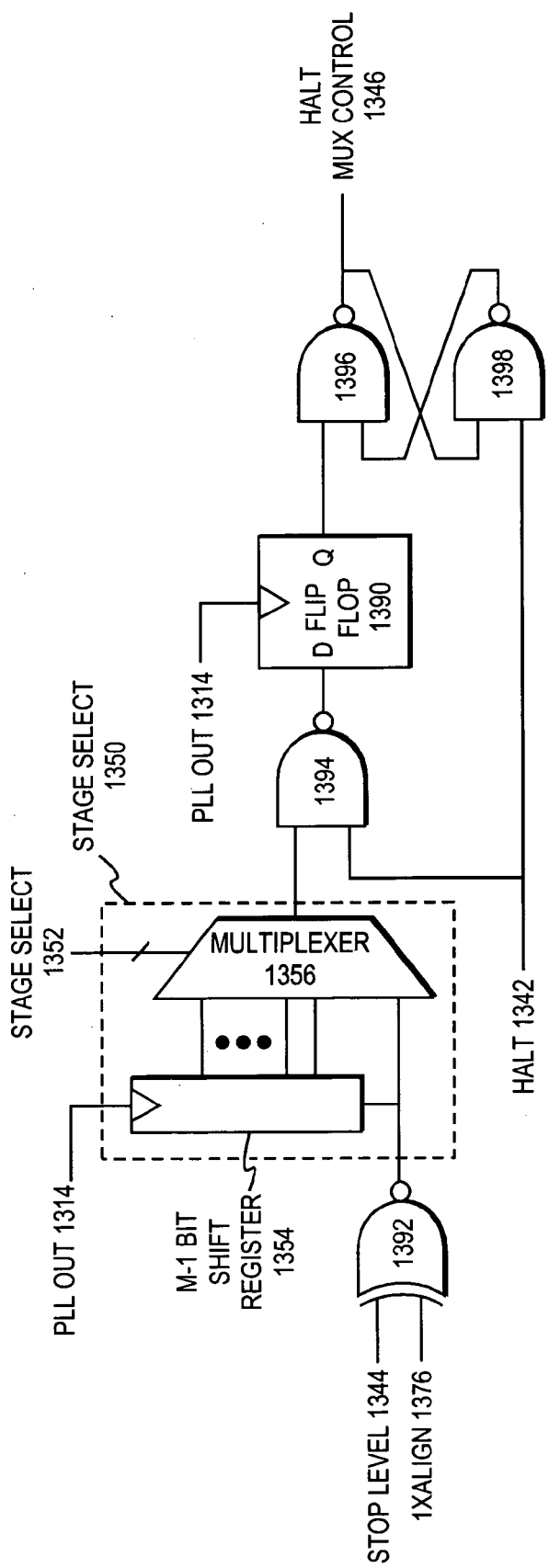
FIG. 13 illustrates one embodiment of a halt control circuit for controllably halting and stepping the multiphase clock.

FIG. 13 illustrates one embodiment of a halt control circuit for controllably halting and stepping the multiphase clock. Referring to FIGS. 11, 12, and 13, the halt control circuitry generates halt multiplexer control 1146 from inputs stop level 644, 1XALIGN 676, halt 642, and PLL out 614.

The 1XALIGN 1376 and STOP LEVEL 1344 are provided as inputs to exclusive NOR gate 1392. STOP LEVEL 1344 indicates whether the selected clock should be stopped at either a high or a low level.

The output of exclusive NOR gate 1392 is provided as an input to stage select circuit 1250. In one embodiment, stage select circuit comprises an M−1 bit shift register 1354 and a multiplexer 1356. The output of exclusive NOR gate 1392 is clocked through shift register 1354 thus cascading the NOR gate 1392 output through the shift register 1354. Multiplexer 1356 receives the output of NOR gate 1392 and the output from each stage of the M−1 bit shift register 1356 as inputs. Multiplexer 1356 selects one of its M inputs as an output in accordance with multi-bit stage select signal 1352.

NAND gate 1394 receives a halt signal 1342 and the output of stage select circuit 1350. The output of NAND gate 1394 is provided as the data input to flip-flop 1390. In one embodiment flip-flop 1390 is a D-type flip-flop.

Cross-coupled NAND gates 1396 and 1398 form a latch providing the halt multiplexer control 1346. Tying HALT 1342 to a low logic level ensures that the halt multiplexer control is also a low logic level. Referring to FIG. 11, the halt control circuit 1140 should be disabled during normal operation of the multiphase clock generator. Multiplexer 1130 selects the gated clock 1120 (A) or the PLL output (B) in accordance with the halt multiplexer control 1146 values of 1 or 0, respectively.

When HALT is enabled, the halt multiplexer control selects the gated clock as the MXCLK when the 1XALIGN 1376 and STOP LEVEL 1344 match. STOP LEVEL indicates which clock level to stop at (i.e., low, high). Note the use of 1XALIGN rather than the CLK1 or the DIST1XALIGN signal in the combinatorial logic of FIG. 13. Due to the high frequency of the MXCLK and the electrical length of the path to the multiple instances of the recovery circuits, the 1XALIGN rather than the CLK1 signal should be used.

Figure 14:
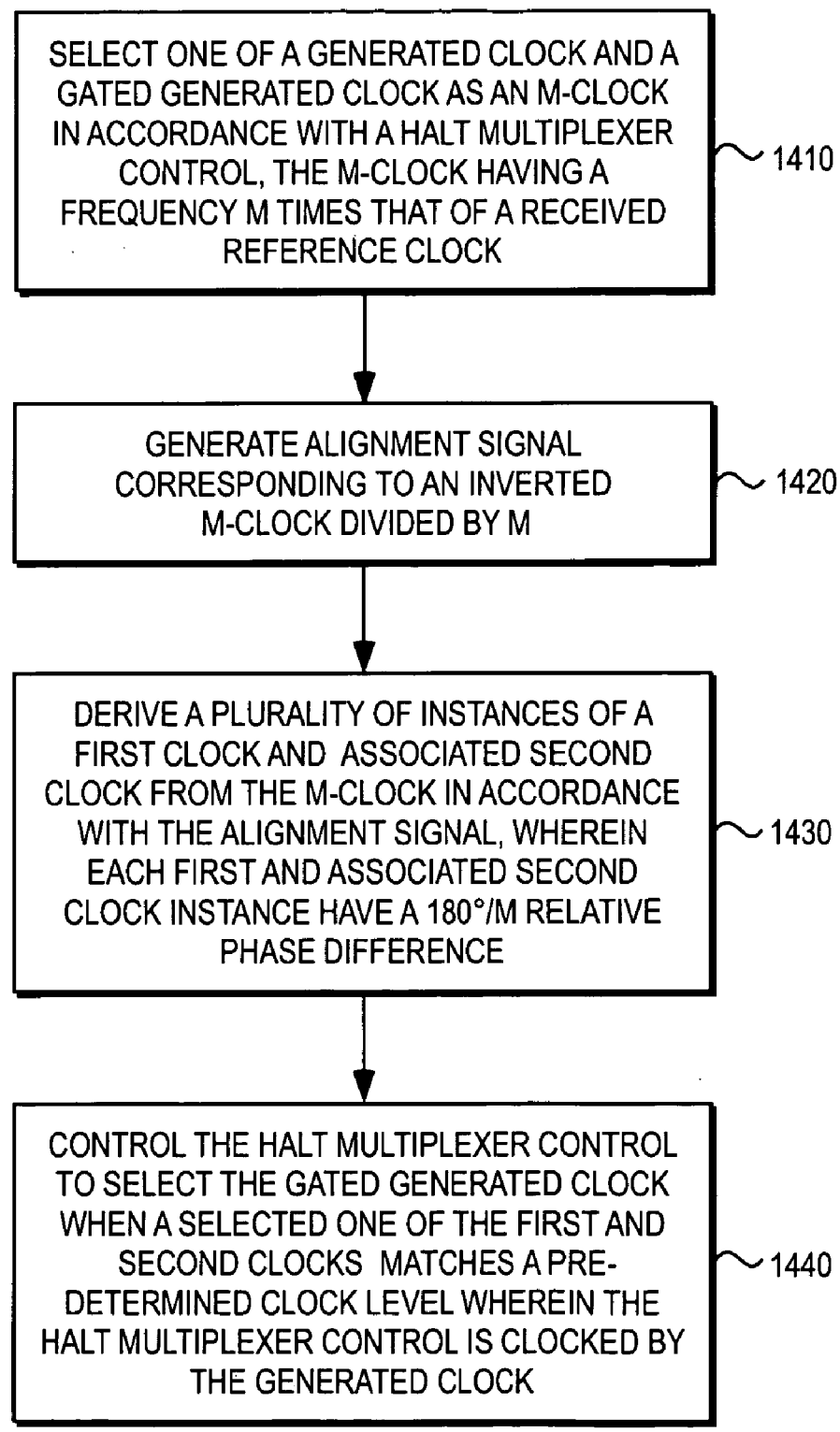
FIG. 14 illustrates one embodiment of a method of generating and controlling the multiphase clock.

FIG. 14 illustrates one embodiment of a method of generating and controlling the multiphase clock. In step 1410, one of a generated clock (e.g., PLL out 1214) and a gated generated clock (e.g., gated clock 1220) is selected as an M-clock in accordance with a halt multiplexer control. The M-clock has a frequency M times that of a received reference clock.

An alignment signal corresponding to an inverted M-clock divided by M is generated in step 1420. A plurality of instances of a first clock and associated second clock are derived from the M-clock in accordance with the alignment signal in step 1430. Each first and associated second clock instance have a relative 180°/M phase difference.

In step 1440, the halt multiplexer control is controlled to select the gated generated clock signal when a selected one of the first and second clocks matches a pre-determined clock level. The halt multiplexer control is clocked by the generated clock for synchronization with the generated clock.

Although the illustrated process is drawn to generation of derivation of two clocks, obviously at least M distinct clocks can be derived from the multiphase clock. Accordingly, the halt multiplexer control can select the gated generated clock signal when a selected one of the M clocks matches a pre-determined clock level.

The halt multiplexer control thus permits the user to stop all instances of the M-clock at a particular level in synchronization with the generated clock. Once the gated generated clock is selected, the user may step the M-clock instances through the M clock cycles such that the plurality of clock instances are synchronized with each other.

Various modifications and changes may be made thereto without departing from the broader spirit and scope of the invention as set forth in the claims. The specification and drawings are, accordingly, to be regarded in an illustrative rather than a restrictive sense.

What is claimed is:

1. A clock generating apparatus comprising:
   a clock generator providing an M-clock having a frequency that is M times that of a received reference clock;
   divider circuitry coupled to provide an alignment signal having a frequency 1/M that of the M-clock; and
   a recovery circuit recovering up to M distinct clocks from the M-clock in accordance with the alignment signal, wherein the recovered clocks have substantially an N•180°/M phase difference from each other, wherein $N \geq 1$.

2. The apparatus of claim 1 wherein the recovery circuit comprises:
   a first flip-flop receiving the alignment signal, wherein the first flip-flop is clocked by the M-clock to provide a first recovered clock; and
   a second flip-flop receiving the first recovered clock, wherein the second flip-flop is clocked by an inverted M-clock to provide a second recovered clock.

3. The apparatus of claim 2 wherein each of the first and second flip-flops is a D-type flip-flop.

4. The apparatus of claim 1 wherein the recovery circuit comprises:
   a plurality of sequential stages, wherein an output of stage i is the $i^{th}$ recovered clock and the input to any next stage (i+1), wherein stage i is clocked by $(-1)^{i-1}$ times the M-clock, wherein the first stage (i=1) receives the alignment signal.

5. The apparatus of claim 4 wherein each stage comprises a D-type flip-flop.

6. The apparatus of claim 1 wherein the clock generator is a phase locked loop circuit.

7. The apparatus of claim 1 wherein $$\frac{M}{N} > 2.$$

8. The apparatus of claim 1 wherein the clock generator, divider circuitry, and recovery circuitry reside on a same integrated circuit die.

9. The apparatus of claim 8 wherein the clock generator, divider circuitry, and recovery circuitry are formed as a metal oxide semiconductor field effect transistor (MOSFET) integrated circuit.

10. A multiphase clock generation apparatus, comprising:
    a clock generator providing an M-clock having a frequency M times that of a received reference clock;
    divider circuitry coupled to provide an alignment signal having a frequency 1/M that of the M-clock; and
    a plurality of recovery circuits, each recovery circuit providing a first clock and a second clock from the M-clock in accordance with the alignment signal, wherein the first and second clocks have substantially an N•180°/M phase difference, wherein $N \geq 1$.

11. The apparatus of claim 10 wherein the first clock associated with any recovery circuit is substantially synchronized with the first clock associated with any other recovery circuit.

12. The apparatus of claim 10 wherein each recovery circuit comprises:
    a first flip-flop receiving the alignment signal, wherein the first flip-flop is clocked by the M-clock to provide the first clock; and
    a second flip-flop receiving the first recovered clock, wherein the second flip-flop is clocked by an inverted M-clock to provide the second clock.

13. The apparatus of claim 12 wherein each of the first and second flip-flops is a D-type flip-flop.

14. The apparatus of claim 10 wherein the clock generator is a phase locked loop circuit, wherein the first and second clocks have a same frequency as the reference clock, wherein the first clock is synchronized with the reference clock.

15. The apparatus of claim 10 wherein $$\frac{M}{N} > 2.$$

16. The apparatus of claim 10 wherein the clock generator, divider circuitry, and recovery circuitry reside on a same integrated circuit die.

17. The apparatus of claim 16 wherein the clock generator, divider circuitry, and recovery circuitry are formed as a metal oxide semiconductor field effect transistor (MOSFET) integrated circuit.

18. A method of generating a multiphase clock, comprising:
    generating an M-clock having a frequency M times that of a received reference clock;
    generating an alignment signal having a frequency 1/M that of the M-clock;
    deriving a first clock from the M-clock in accordance with the alignment signal; and
    deriving a second clock from the first clock, wherein the first and second clocks have substantially a 180°/M phase difference.

19. The method of claim 18 wherein deriving the first clock includes latching the alignment signal in accordance with the M-clock to provide the first clock, wherein deriving the second clock includes latching the first clock in accordance with an inverted M-clock to provide the second clock.

20. The method of claim 18 wherein $M \geq 3$.

21. A clock generating apparatus comprising:
    clock generator means providing an M-clock having a frequency that is M times that of a received reference clock;
    divider circuitry means providing an alignment signal having a frequency 1/M that of the M-clock; and
    recovery circuit means recovering up to M distinct clocks from the M-clock in accordance with the alignment signal, wherein the recovered clocks have substantially a 180°/M phase difference from each other.

* * * * *